(12) United States Patent
Hamaguchi et al.

(10) Patent No.: US 10,461,049 B2
(45) Date of Patent: Oct. 29, 2019

(54) SEMICONDUCTOR DEVICE AND MANUFACTURING METHOD THEREFOR

(71) Applicant: Mitsubishi Electric Corporation, Tokyo (JP)

(72) Inventors: Takuya Hamaguchi, Tokyo (JP); Yosuke Nakata, Tokyo (JP); Seiya Nakano, Tokyo (JP); Masayoshi Tarutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 130 days.

(21) Appl. No.: 15/740,912

(22) PCT Filed: Dec. 14, 2015

(86) PCT No.: PCT/JP2015/084960
§ 371 (c)(1),
(2) Date: Dec. 29, 2017

(87) PCT Pub. No.: WO2017/103978
PCT Pub. Date: Jun. 22, 2017

(65) Prior Publication Data
US 2018/0190605 A1    Jul. 5, 2018

(51) Int. Cl.
*H01L 23/00* (2006.01)
*H01L 29/45* (2006.01)
*H01L 23/31* (2006.01)

(52) U.S. Cl.
CPC .............. *H01L 24/05* (2013.01); *H01L 24/32* (2013.01); *H01L 24/83* (2013.01); *H01L 29/45* (2013.01); *H01L 23/3157* (2013.01); *H01L 2224/04026* (2013.01); *H01L 2224/05124* (2013.01); *H01L 2224/05624* (2013.01);
(Continued)

(58) Field of Classification Search
CPC .......... H01L 24/05; H01L 24/32; H01L 24/83
See application file for complete search history.

(56) References Cited

U.S. PATENT DOCUMENTS

| 2011/0290863 | A1 | 12/2011 | Kajiwara et al. |
| 2012/0306079 | A1 | 12/2012 | Nakano et al. |
| 2018/0174938 | A1* | 6/2018 | Uchida ............... H01L 29/6606 |

FOREIGN PATENT DOCUMENTS

| JP | 2009-200067 A | 9/2009 |
| JP | 2011-249257 A | 12/2011 |
| JP | 2012-253058 A | 12/2012 |

OTHER PUBLICATIONS

International Search Report issued in PCT/JP2015/084960, dated Mar. 1, 2016.
(Continued)

*Primary Examiner* — Douglas M Menz
(74) *Attorney, Agent, or Firm* — Studebaker & Brackett PC

(57) ABSTRACT

An aluminum electrode (2) is provided on a semiconductor device (1). A metallic film (3) for a solder joint is provided on the aluminum electrode (2). The organic protective film (4) is apart from the metallic film (3). An interval between the organic protective film (4) and the metallic film (3) is equal to or greater than half of a thickness of the organic protective film (4). Thus, even when the organic protective film (4) is deformed during sinter joining, the stress is not transmitted to the metallic film (3). Therefore, it is possible to prevent the solder connection metallic film (3) from cracking.

13 Claims, 2 Drawing Sheets

(52) U.S. Cl.
CPC ............... *H01L 2224/29339* (2013.01); *H01L 2224/83001* (2013.01); *H01L 2224/83007* (2013.01); *H01L 2224/8384* (2013.01); *H01L 2924/3512* (2013.01); *H01L 2924/37001* (2013.01)

(56) References Cited

OTHER PUBLICATIONS

International Preliminary Report on Patentability issued in corresponding International Application No. PCT/JP2015/084960; dated Jun. 28, 2018.

\* cited by examiner

SEMICONDUCTOR DEVICE AND MANUFACTURING METHOD THEREFOR

FIELD

The present invention relates to a semiconductor device and a manufacturing method therefor capable of preventing cracking of a metallic film for solder connection.

BACKGROUND

For semiconductor devices having excellent power cycle life and requiring high reliability, a metallic film for a solder joint is formed on each semiconductor substrate (e.g., see PTL 1).

CITATION LIST

Patent Literature

[PTL 1] JP 2012-253058 A

SUMMARY

Technical Problem

When a rear-surface electrode of a semiconductor device is joined by sintering to a circuit pattern of an insulating substrate, the semiconductor device is pressurized from a front-surface side of the semiconductor device. In general, as organic protective films, it is preferable to use a material having a low Young's modulus to prevent cracking caused by external stress in a wafer process or a module assembly step or stress from a sealing material of the module. For example, a film made of a polyimide having a Young's modulus on about 3 GPa and formed to a thickness of 5 µm or more can be made to function as a protective film. Especially when the organic protective film is cracked in the wafer process, the plated film grows abnormally from the cracked position in a subsequent plating step, causing degradation in yield or contamination of the wafer process, and so it is preferable to select a material which has a low Young's modulus and which is hardly cracked. However, since it has a Young's modulus (constant of proportionality between distortion and stress in a coaxial direction) lower than that of a metallic film for solder connection, the organic protective film is deformed under a pressure of Ag sinter in the module assembly step. Since the organic protective film in a conventional semiconductor device is in contact with the metallic film for solder connection, there is a problem that stress of the deformed organic protective film may cause an end portion of the metallic film to be cracked.

The present invention has been implemented to solve the above-described problems, and it is an object of the present invention to provide a semiconductor device and a manufacturing method therefor capable of preventing cracking of a metallic film for solder connection.

Solution to Problem

A semiconductor device according to the present invention includes: a semiconductor device; an aluminum electrode provided on the semiconductor substrate; a metallic film for a solder joint provided on the aluminum electrode; and an organic protective film provided on the aluminum electrode and apart from the metallic film, wherein an interval between the organic protective film and the metallic film is equal to or greater than half of a thickness of the organic protective film.

Advantageous Effects of Invention

According to the present invention, the organic protective film is apart from the metallic film and an interval between the two is equal to or greater than half of the thickness of the organic protective film. Thus, even when the organic protective film is deformed during sinter joining, the stress is not transmitted to the metallic film. Therefore, it is possible to prevent the solder connection metallic film from cracking.

DESCRIPTION OF EMBODIMENTS

A semiconductor device and a manufacturing method therefor according to the embodiments of the present invention will be described with reference to the drawings. The same components will be denoted by the same symbols, and the repeated description thereof may be omitted.

First Embodiment

Figure 1:
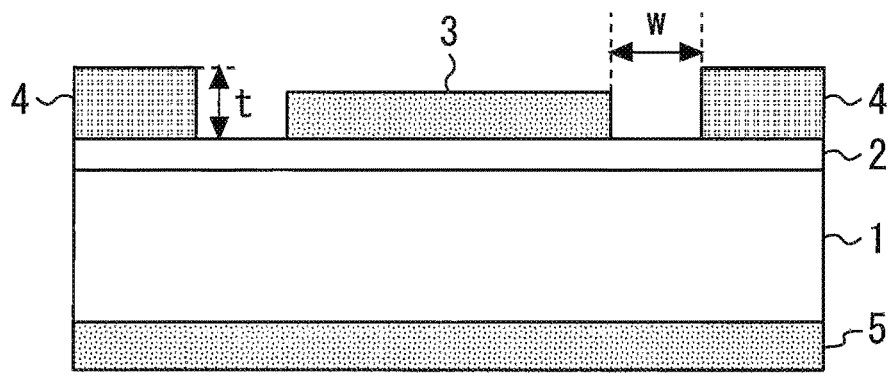
FIG. 1 is a cross-sectional view illustrating a semiconductor device according to a first embodiment of the present invention.

FIG. 1 is a cross-sectional view illustrating a semiconductor device according to a first embodiment of the present invention. A semiconductor substrate 1 includes, for example, a silicon substrate and a semiconductor film epitaxially grown on the silicon substrate. An aluminum electrode 2 is formed on this semiconductor substrate 1. A solder connection metallic film 3 is formed on the aluminum electrode 2. An organic protective film 4 is formed on the aluminum electrode 2, apart from the metallic film 3. A rear-surface electrode 5 is formed on a rear surface of the semiconductor substrate 1. An interval w between the organic protective film 4 and the metallic film 3 is equal to or greater than half of a thickness t of the organic protective film 4 (w≥t/2).

Figure 2:
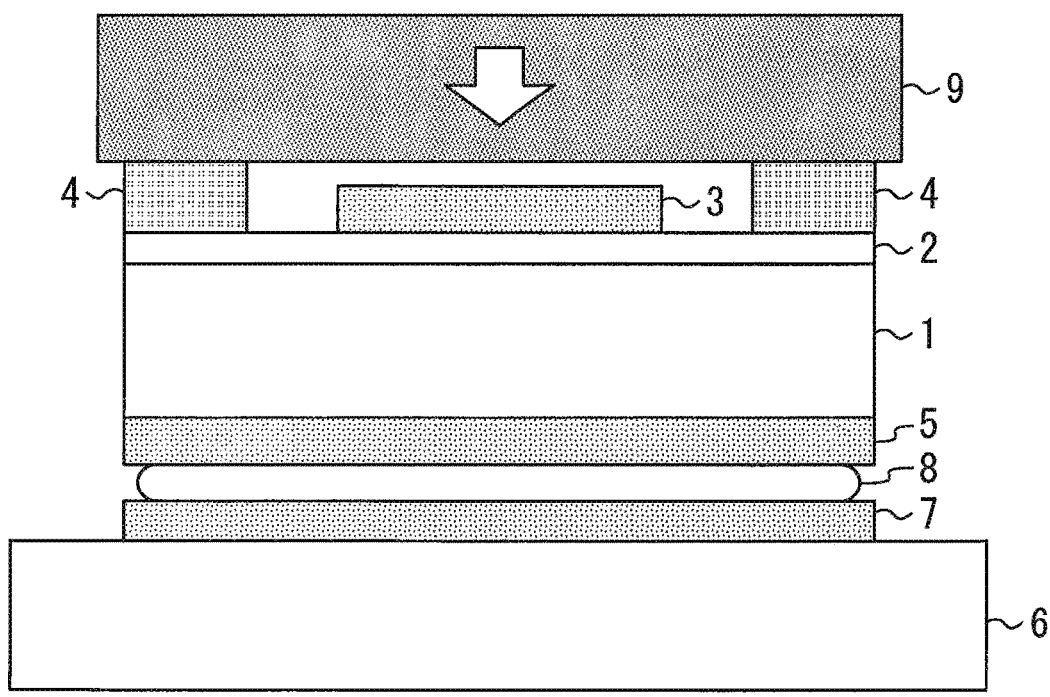
FIG. 2 is a cross-sectional view illustrating a situation in which the semiconductor device shown in FIG. 1 is joined by sintering to a circuit pattern of an insulating substrate.

Next, a method for manufacturing a semiconductor device according to the present embodiment will be described. FIG. 2 is a cross-sectional view illustrating a situation in which the semiconductor device shown in FIG. 1 is joined by sintering to a circuit pattern of an insulating substrate. The aluminum electrode 2 is formed on the semiconductor substrate 1 first. The solder connection metallic film 3 and the organic protective film 4 apart from the metallic film 3 are formed on the aluminum electrode 2. The rear-surface electrode 5 is formed on the rear surface of the semiconductor substrate 1.

Next, as shown in FIG. 2, Ag particles 8 coated with an organic film are applied between the rear-surface electrode 5 and a circuit pattern 7 of the insulating substrate 6, the semiconductor substrate 1 is heated while being pressurized from the front-surface side using a pressurization jig 9 and the rear-surface electrode 5 and the circuit pattern 7 are thereby joined together by sintering with Ag.

Figure 3:
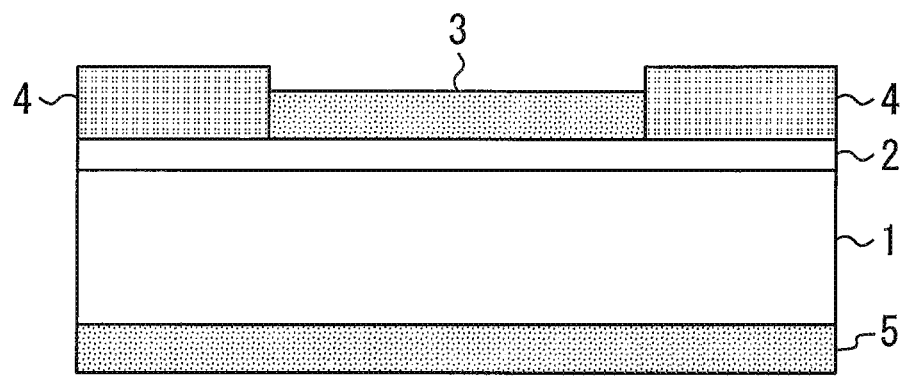
FIG. 3 is a cross-sectional view illustrating a semiconductor device according to a comparative example.

Next, effects of the present embodiment will be described in comparison with a comparative example. FIG. 3 is a cross-sectional view illustrating a semiconductor device according to a comparative example. In the comparative example, the organic protective film 4 is in contact with the metallic film 3. The organic protective film 4 has a Young's modulus on about 3 GPa, is deformed by pressurization when it is joined by sintering, and an end portion of the metallic film 3 is cracked by the stress.

On the other hand, according to the present embodiment, the organic protective film 4 is apart from the metallic film 3 and an interval between the two is equal to or greater than half of the thickness of the organic protective film 4. Thus, even when the organic protective film 4 is deformed during sinter joining, the stress is not transmitted to the metallic film 3. Therefore, it is possible to prevent the solder connection metallic film 3 from cracking.

The metallic film 3 is a substance, joining strength to solder of which is higher than that of the aluminum electrode 2. This makes it possible to easily obtain an excellent solder joint interface.

The organic protective film 4 never reacts with solder. This prevents solder from wet-spreading over anything other than the joint between the metallic film 3 and a lead frame, making it possible to prevent solder from becoming thinner and prevent deterioration of joining strength.

Furthermore, when the rear-surface electrode 5 is soldered to the circuit pattern 7 of the insulating substrate 6, there is no need to apply a pressure to such an extent that the organic protective film 4 is deformed from the front-surface side of the semiconductor substrate 1. However, when the rear-surface electrode 5 is joined by sintering to the circuit pattern 7 of the insulating substrate 6, the organic protective film 4 is deformed by pressurization, and so the above-described configuration in the present embodiment becomes necessary.

Use of the Ag film as a joining agent for sinter joining makes it possible to provide a joint having high adhesion strength between Cu or Ni and a non-metallic member and excellent conductivity and heat dissipation.

The metallic film 3 has Ni or Cu as a principal ingredient. Since Ni and Cu are widely used as electrode members for semiconductor devices, stable production is made possible.

Second Embodiment

Figure 4:
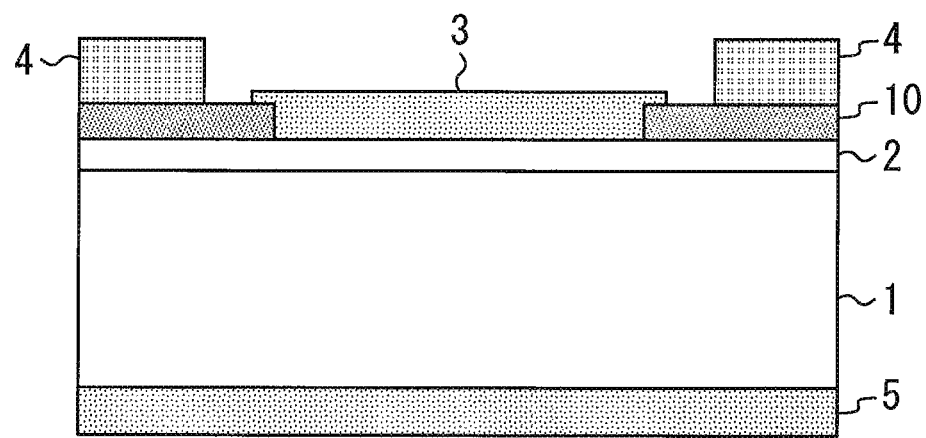
FIG. 4 is a cross-sectional view illustrating a semiconductor device according to a second embodiment of the present invention.

FIG. 4 is a cross-sectional view illustrating a semiconductor device according to a second embodiment of the present invention. In the present embodiment, an intermediate layer 10 covers the aluminum electrode 2 between the metallic film 3 and the organic protective film 4. The intermediate layer 10 has a Young's modulus on about 195 GPa, which is a substance having a Young's modulus higher than that of the organic protective film 4 and being hardly deformed, and is therefore unaffected by stress by deformation of the organic protective film 4.

In the method for manufacturing a semiconductor device according to the present embodiment, the intermediate layer 10 having an opening is formed on the aluminum electrode 2. The solder connection metallic film 3 is formed using this intermediate layer 10 as a mask using a wet plating method. By forming the metallic film 3 using the wet plating method, a metallic film which is thicker than the intermediate layer 10 can be easily formed. By forming the thick metallic film 3, Ni spreads into the solder with thermal load or through high temperature operation during solder joining, thereby preventing the film thickness from reducing, thus making it possible to improve reliability of high Tj durability.

For example, a SiN film is used as the intermediate layer 10. When the metallic film 3 is formed using the intermediate layer 10 as a mask using the wet plating method, the metallic film 3 generally grows isotropically, thus growing also in the horizontal direction when it exceeds the height of the intermediate layer 10, allowing the end portion of the metallic film 3 to stretch out over the intermediate layer 10. This allows the metallic film 3 to mainly receive the stress received from a top surface direction of the semiconductor device during Ag sintering. The metallic film 3 is deformed and adds stress to the intermediate layer 10, but if the SiN film is used for the intermediate layer 10, since adhesion between the aluminum electrode 2 and the intermediate layer 10 is strong, it is possible to prevent exfoliation between the aluminum electrode 2 and the intermediate layer 10.

Furthermore, the intermediate layer 10 is also formed between the aluminum electrode 2 and the end portion of the organic protective film 4. However, the intermediate layer 10 need not be formed in all regions between the aluminum electrode 2 and the organic protective film 4, and the intermediate layer 10 needs only to have a desired width starting from the end portion of the organic protective film 4. Thus, providing a location where the aluminum electrode 2 and the organic protective film 4 are partially in direct contact with each other can strengthen adhesion of the organic protective film 4 and further improve product reliability.

The semiconductor substrate 1 according to the first and second embodiments is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Since the rear-surface electrode 5 of the semiconductor substrate 1 is joined by sintering to the circuit pattern 7 on the insulating substrate 6 without using solder, it is possible to implement a power module with excellent conductivity and heat dissipation. Therefore, it is possible to secure reliability such as power cycle durability when applied not only to a MOSFET, IGBT and diode made of Si but also to a SiC product requiring an operating joining temperature range in a higher temperature environment.

REFERENCE SIGNS LIST 1 semiconductor substrate; 2 aluminum electrode; 3 metallic film; 4 organic protective film; 5 rear-surface electrode; 6 insulating substrate; 7 circuit pattern; 8 Ag particle; 10 intermediate layer

The invention claimed is:

1. A semiconductor device comprising:
   a semiconductor substrate;
   an aluminum electrode provided on the semiconductor substrate;
   a metallic film for a solder joint provided on the aluminum electrode; and
   an organic protective film provided on the aluminum electrode and apart from the metallic film,
   wherein an interval between the organic protective film and the metallic film is equal to or greater than half of a thickness of the organic protective film.

2. The semiconductor device according to claim 1, wherein the metallic film has joining strength to solder higher than that of the aluminum electrode and is harder than the aluminum electrode.

3. The semiconductor device according to claim 1, wherein the organic protective film has a Young's modulus lower than that of the aluminum electrode.

4. The semiconductor device according to claim 1, further comprising an intermediate layer covering the aluminum electrode between the metallic film and the organic protective film and having a Young's modulus higher than that of the organic protective film.

5. The semiconductor device according to claim 4, wherein an end portion of the metallic film stretches out over the intermediate layer.

6. The semiconductor device according to claim 4, wherein the intermediate layer is provided between the aluminum electrode and an end portion of the organic protective film.

7. The semiconductor device according to claim 4, wherein the metallic film is formed using the intermediate layer as a mask using a plating method.

8. The semiconductor device according to claim 1, further comprising:
   a rear-surface electrode provided on a rear surface of the semiconductor substrate; and
   an insulating substrate including a circuit pattern,
   wherein the rear-surface electrode is joined by sintering to the circuit pattern.

9. The semiconductor device according to claim 8, further comprising an Ag film as a joining agent for sinter joining.

10. The semiconductor device according to claim 1, wherein the metallic film has Ni or Cu as a principal ingredient.

11. The semiconductor device according to claim 1, wherein the semiconductor substrate is made of a wide-band-gap semiconductor.

12. A manufacturing method for a semiconductor device comprising:
    forming an aluminum electrode on a semiconductor substrate;
    forming a metallic film for a solder joint and an organic protective film apart from the metallic film on the aluminum electrode; and
    forming a rear-surface electrode on a rear surface of the semiconductor substrate; and
    applying an Ag particle between the rear-surface electrode and a circuit pattern of an insulating substrate and pressurizing the semiconductor substrate from a front-surface side to join the rear-surface electrode and the circuit pattern by sintering with Ag,
    wherein an interval between the organic protective film and the metallic film is equal to or greater than half of a thickness of the organic protective film.

13. The manufacturing method for a semiconductor device according to claim 12, further comprising:
    forming an intermediate layer having an opening on the aluminum electrode; and
    forming the metallic film using the intermediate layer as a mask using a plating method,
    wherein the intermediate layer covers the aluminum electrode between the metallic film and the organic protective film and has a Young's modulus higher than that of the organic protective film.

* * * * *